(12) United States Patent
Hung et al.

(10) Patent No.: US 7,759,136 B2
(45) Date of Patent: Jul. 20, 2010

(54) CRITICAL DIMENSION (CD) CONTROL BY SPECTRUM METROLOGY

(75) Inventors: Chang-Cheng Hung, Jhubei (TW);
Hung Chang Hsieh, Hsin-Chu (TW);
Shih-Ming Chang, Hsinchu (TW);
Wen-Chuan Wang, Hsin-Chu (TW);
Chi-Lun Lu, Hsinchu (TW); Allen Hsia, Hsin-Chu (TW); Yen-Bin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 55 days.

(21) Appl. No.: 11/530,164

(22) Filed: Sep. 8, 2006

(65) Prior Publication Data

US 2007/0231935 A1    Oct. 4, 2007

Related U.S. Application Data

(60) Provisional application No. 60/787,131, filed on Mar. 29, 2006.

(51) Int. Cl.
*G01R 31/26* (2006.01)
*H01L 21/66* (2006.01)

(52) U.S. Cl. ................ 438/14; 438/8; 438/16; 438/706; 438/745; 257/E21.529; 257/E21.521

(58) Field of Classification Search .............. 438/8, 438/14, 16, 706, 745, FOR. 101, FOR. 142, 438/637, 638; 257/E21.579, E21.529, E21.521
See application file for complete search history.

(56) References Cited

U.S. PATENT DOCUMENTS

| 4,289,188 A * | 9/1981 | Mizutani et al. ............ 216/60 |
| 5,516,608 A | 5/1996 | Hobbs et al. |
| 5,629,772 A | 5/1997 | Ausschnitt |
| 6,368,879 B1 | 4/2002 | Toprac |
| 6,561,706 B2 | 5/2003 | Singh et al. |
| 6,689,519 B2 | 2/2004 | Brown et al. |
| 6,745,086 B1 | 6/2004 | Pasadyn et al. |
| 6,856,408 B2 * | 2/2005 | Raymond ................ 356/601 |
| 6,869,739 B1 * | 3/2005 | Ausschnitt et al. .......... 430/30 |

(Continued)

FOREIGN PATENT DOCUMENTS

CN    1609711 A    4/2005

(Continued)

OTHER PUBLICATIONS

Ray J. Hoobler et al., "Optical Critical Dimension (OCD) Measurements For Profile Monitoring And Control: Applications For Mask Inspection and Fabrication", Proceedings of SPIE vol. 5256 23rd Annual BACUS Symposium on Photomask Technology, pp. 638-645.

*Primary Examiner*—Michelle Estrada
(74) *Attorney, Agent, or Firm*—Haynes and Boone, LLP

(57) ABSTRACT

A method for patterning a substrate includes forming a material layer on the substrate; performing a first etching on the material layer to form a pattern; measuring the pattern of the material layer using an optical spectrum metrology tool; determining whether the measuring indicates that the etching step achieved a predefined result; and producing an etching recipe and performing a second etching of the material layer using the etching recipe if the predefined result was not achieved.

16 Claims, 10 Drawing Sheets

U.S. PATENT DOCUMENTS

| | | | |
|---|---|---|---|
| 7,094,613 B2 * | 8/2006 | Mui et al. | 438/9 |
| 7,467,064 B2 * | 12/2008 | Vuong et al. | 702/181 |
| 2002/0177245 A1 | 11/2002 | Sonderman et al. | |
| 2004/0058533 A1 * | 3/2004 | Sakai et al. | 438/689 |
| 2005/0085090 A1 | 4/2005 | Mui et al. | |
| 2005/0153564 A1 | 7/2005 | Mak et al. | |
| 2005/0197721 A1 | 9/2005 | Chen et al. | |

FOREIGN PATENT DOCUMENTS

| | | | |
|---|---|---|---|
| JP | 01073621 A | * | 3/1989 |
| JP | 2003258052 A | * | 9/2003 |

* cited by examiner

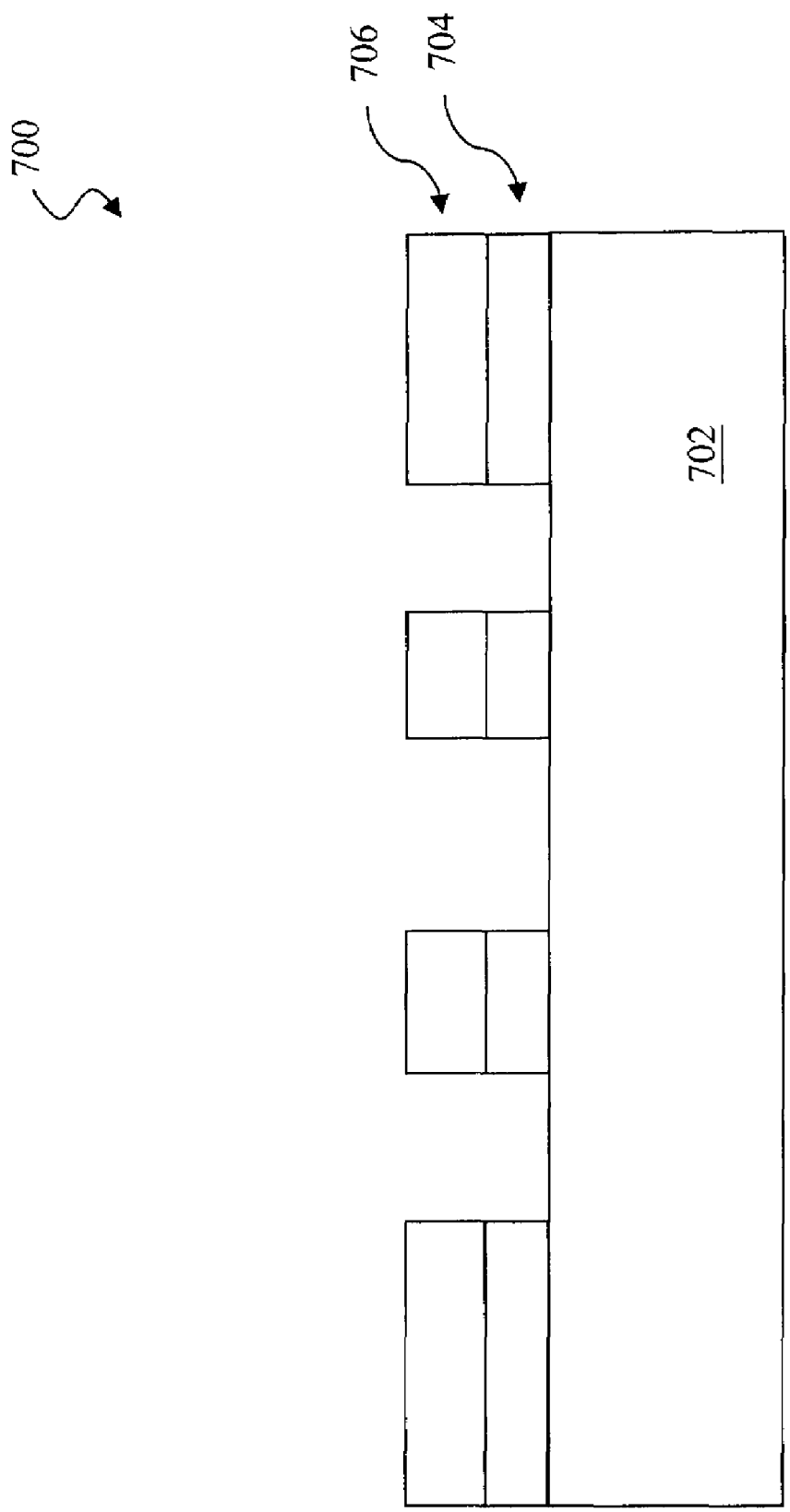

CRITICAL DIMENSION (CD) CONTROL BY SPECTRUM METROLOGY

CROSS-REFERENCE

This application claims priority from U.S. Provisional Patent Application Ser. No. 60/787,131 filed on Mar. 29, 2006, entitled "Reticle process Control by optical Spectrum Metrology". This application is related to U.S. patent application Ser. No. 10/899,612 filed on Jul. 27, 2004 and U.S. patent application Ser. No. 10/979,515 filed on Nov. 2, 2004, both of which are hereby incorporated by reference.

BACKGROUND

With the advancement of semiconductor manufacturing techniques, current semiconductor fabrication technologies continue to reduce pattern sizes and increase transistor and circuit speeds. To ensure a pattern is properly sized (e.g., devices do not improperly overlap or interact with one another), design rules are used to define parameters, such as the tolerances between devices and interconnecting lines, and the widths of such lines. A design rule limitation, also known as a critical dimension (CD), can define a minimum width of a line or a minimum space between two lines permitted in the fabrication of the devices for a given technology (e.g., 90 nm). CD errors in a device or between devices may arise from any number of sources, such as optical (e.g., lens field curvature or lens aberration in a photolithography system), mechanical, or chemical (e.g., thickness non-uniformity of resist coating and antireflection coating (ARC)) sources. However, current metrology tools, such as a critical dimension scanning electron microscope (CD-SEM), cannot obtain sufficient CD information from various pattern profiles during photomask fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 7a through 7f illustrate an exemplary photomask during various fabrication stages.

DETAILED DESCRIPTION

Figure 1:
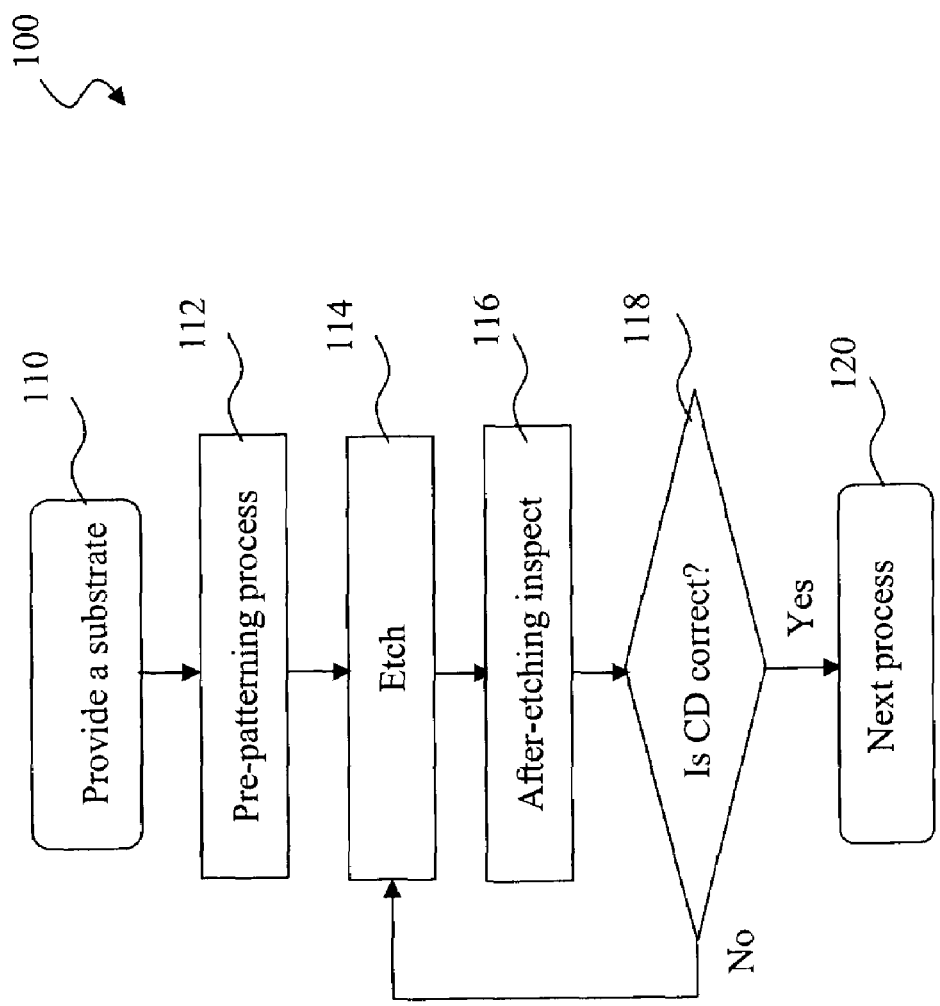
FIG. 1 illustrates a flow chart of one embodiment of a method for identifying a potential CD error during a manufacturing process and adjusting the process to compensate for that error.
Figure 3A:
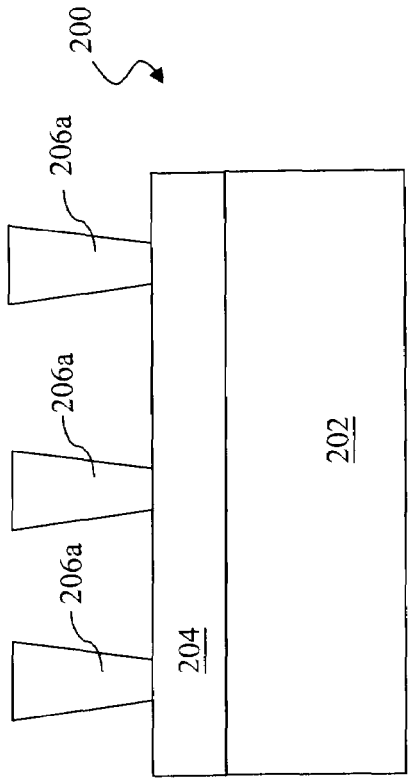
FIGS. 2, 3a, 3b, 3c, 4a, 4b, 4c, and 5 illustrate cross-sectional views of various embodiments of a photomask during fabrication stages.
Figure 3C:
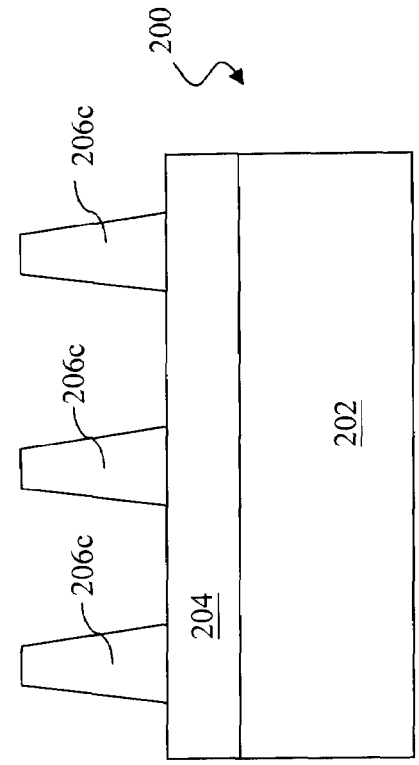
Figure 2:
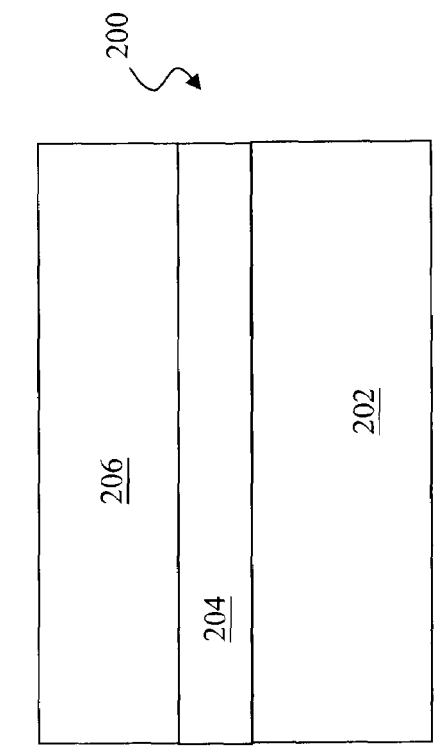
Figure 3B:
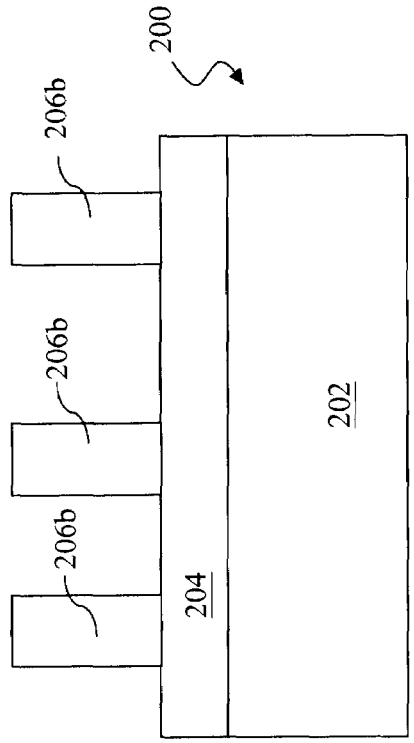

It is to understood that the following disclosure provides many different embodiments, or examples, for implementing different features of various embodiments. Specific examples of components and arrangements are described simplistically for purposes of clarity. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a method 100 is used to fabricate a mask, which can be used to fabricate semiconductor wafers and the like. With additional reference to FIGS. 2, 3a, 3b, 3c, 4a, 4b, 4c, and 5 illustrating sectional views of various embodiments of a photomask during fabrication stages, the method 100 and a system to make the same are described. The photomask may also be referred to as mask, or reticle. Even though the mask is employed as example to illustrate the disclosed method and system, it is not limited to mask fabrication and may be extended to semiconductor wafer fabrication.

The method 100 begins at step 110 with a mask 200. The mask 200 comprises a transparent substrate 202 having fused quartz ($SiO_2$), calcium fluoride ($CaF_2$), or other suitable material. The mask 200 may further comprise an absorption layer 204 formed using a plurality of processes and materials, such as depositing a metal film made with chromium (Cr) and iron oxide, or an inorganic film made with MoSi, ZrSiO, SiN, and/or TiN. The absorption layer 204 may have a multilayer structure. For example, the mask 200 may include a molybdenum silicide (MoSi) layer having partial light absorption and/or a chromium (Cr) layer having a complete absorption. The mask 200 may further comprise one or more anti-reflective coating (ARC) layers disposed between various interfaces. The mask 200 comprises a photoresist (resist or PR) layer 206 overlying the absorption layers 204, coated by a method such as spin-on coating. The resist layer 206 may be formed at the next step.

At step 112, the mask in prepared using one or more pre-patterning processes. The pre-patterning processes may include forming a patterned resist layer or a hard mask layer such as those shown in FIGS. 3a to 3c. In one example, forming a patterned resist layer includes resist coating, pre-baking, exposing, post-exposure baking (PEB), developing, and hard baking. The pre-patterning processes may be utilized using associated tools such as a photoresist coating system, a baking tool, an exposure tool, and/or a development tool. The baking tool may be a chamber configured with at least one heater tunable to a temperature proper for soft baking, hard baking, and PEB, respectively. The exposure tool may be a writing system using an e-beam, an ion-beam, a photo-beam, or other suitable radiation beam to "write" a pattern on a resist layer. The exposure tool may be other tools such as a stepper and a scanner having enough resolution for patterning a mask. The above tools may have standard interfaces such that they can be built together and have proper connection and communication. The above pre-patterning tools may be connected, combined, and/or integrated for high quality and efficiency. The pre-patterning process may comprise at least one inspection step such as an after-development inspection (ADI). The ADI may comprise measuring critical dimensions (CD) and profile of the patterned features formed in the resist layer. The masks 200 in FIGS. 3a to 3c each have the same critical dimension but different profile under a normal two-dimensional CD metrology tool and will be explained in more details later.

Figure 4A:
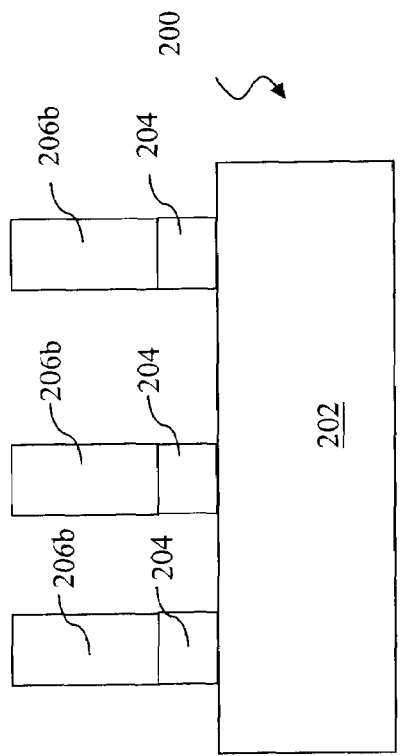
Figure 4B:
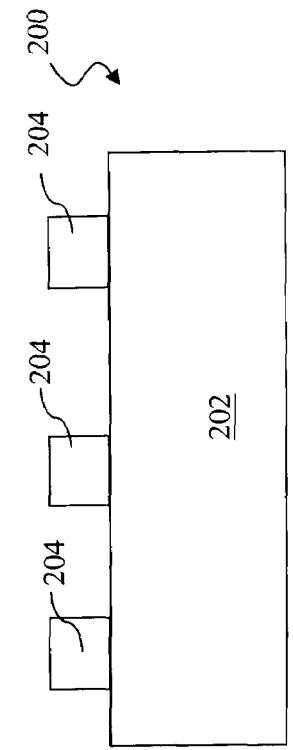
Figure 4C:
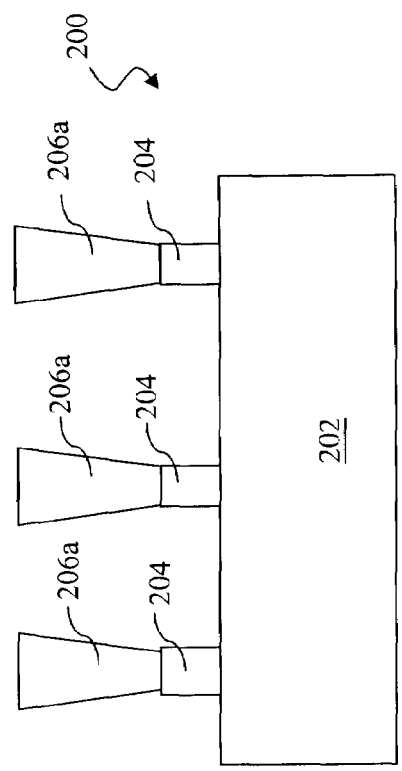

The method 100 proceeds to step 114 in which an etching or other suitable process may be employed to partially or substantially remove the absorption layer underlying the patterned resist layer or hard mask layer. The exposed portions of the absorption layer may be removed while the covered portions remain substantially unchanged such that a plurality of patterned features, as shown in FIGS. 4a, 4b, and 4c, are formed in the absorption layer 204. The etching process may be a suitable process such as a wet etching or dry etching to transfer the pattern to the underlying absorption layer. The etching process may be carried out in a gas-phase. The etching process may be either purely chemical (e.g., plasma etching), purely physical (e.g., ion milling), or combination thereof (e.g., reactive ion etching, or RIE). The underlying layer to be patterned may alternatively be the transparent substrate wherein the transparent substrate may be partially or substantially removed. For example, phase-shift mask (PSM) technology may have the transparent substrate to be etched in a pattern to introduce proper phase shift.

The method 200 proceeds to step 116 to implement an after-etching inspection (AEI). The AEI may be performed by one or more metrology tools to inspect and check for defects, contamination, and critical dimension. Furthermore, AEI comprises an optical spectrum (e.g., optical critical dimension or OCD) metrology tool to measure CDs and/or profiles of the patterned features in the resist (or hard mask) layer 206 and/or the absorption layer 204.

During mask manufacturing, CD controls are implemented in various steps to ensure dimensions such as spacing and line width are maintained within predefined specifications. Currently, to identify CD errors, CD measurements are generally conducted by destructive methods such as critical dimension scanning electron microscope (CD-SEM). CD-SEM uses a scanning electron microscope to take top-down images of pattern features (e.g. resist features) and extract dimension information from those images. Only the top surface of the patterned features is imaged by the CD-SEM. There may exist a bias between the measurement and the actual features. The resist layer 206 may form a plurality of features having inverted trapezoidal sidewalls such as 206a, vertical sidewalls such as 206b, and a tapered sidewalls such as 206c. In an exemplary case of measurement of metal-insulator-semiconductor (MOS) transistor gate length, the gate length at the interface between the gate and the substrate is of interest. If the resist profile has vertical sidewalls (206b) or tapered sidewalls (206c), then the CD-SEM may return the correct measurement of interest. However, if the profile has an inverted trapezoidal shape (206a), then the measured CD will exceed the actual CD of interest. Furthermore, these offline approaches increase the production cycle time, contamination, and wafer production cost. The OCD metrology tool provides three-dimensional imaging and enables non-destructive and even real-time measurement and profiling of critical dimensions on mask without the limitations and drawbacks associated with CD-SEM. The CD and profiling measurement from the OCD metrology tool may be accumulated to provide batch-to-batch information for process optimization and control. For example, batch-to-batch profile variation may be utilized to monitor and track process trend and batch related shifting, and further utilized to tune etching process and/or exposure dose to the associated batch.

In the present embodiment, the OCD metrology tool employs a photon beam to image the patterned features for critical dimensions and profile. The OCD uses polarized reflectance allowing for the separation of transverse electric and transverse magnetic modes of light reflected from a patterned substrate. The tool determines linewidths and profiles in mask fabrication. OCD may employ a periodic grating test-structure such as regular spaced lines formed along with the patterned features. An optical beam shines onto the grating test-structure and the resulting diffracted light is measured for dimension and profile information of the patterned features. The OCD metrology tool may image a profile of the patterned layer, extract proper CDs from the profile, and provide information for evaluation and process control.

The OCD metrology tool may be a commercially available system based on a technology such as Optical Digital Profilometry (ODP). The ODP (such as has been developed by Timbre Technologies Inc.) is an optical, nondestructive, inline measurement technique utilizing Maxwell's principles to generate digital cross-sectional representations of integrated circuit features. In the present embodiment, ODP employs a light source to extract precise CD information from a periodic grating structure. As the light is reflected from a patterned layer, it is gathered by an optical detector and analyzed by the ODP. A Timbre Profiler Application Server (PAS), paired with a spectroscopic ellipsometer, utilizes the spectroscopic single angle approach coupled with ellipsometry to extract detailed CD information of the patterned features using both intensity (tan y) and phase (cos Δ) information in the reflected light.

The method 100 proceeds to step 118, in which a determination is made as to whether the etching has been achieved and CDs are within a predefined specification. If a CD is not correct, the method 100 returns to step 114 and performs an additional etching process on the mask. It is understood that this additional etching process may take place in the same etching tool as the original step 114, or may take place in another etching tool. The steps 114-118 may be repeated many times until it is determined in step 118 that the CD measurements fall within a desired range. For example, CD mean to target (MTT) may be within about 7 nanometers. The phase MTT may be within about 3 degrees. In some embodiments, step 116 and/or step 118 may be performed simultaneously with step 114 and the original etching process may be continued (rather than using an additional etching step). In other embodiments, the mask 200 may not undergo a further etching process, but the method 100 may be used to adjust etching parameters (e.g., duration, power, and/or temperature) of the etching process based on the CD measurements. If the CD measurements are correct (e.g., fall within a predefined range), then the method continues to step 120, where the resist layer is striped and the mask may go to other processes including other etching process. In another embodiment, the determination may comprise adjusting the recipe of a subsequent etch process.

Figure 5:
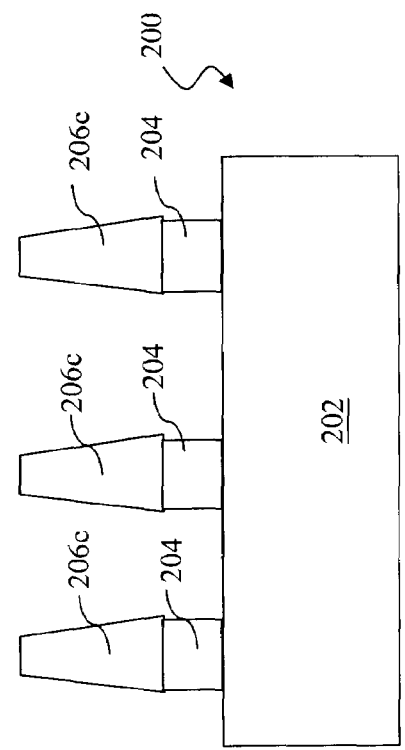

The method 100 proceeds to step 120 to resume the process flow, including stripping the resist layer as shown in FIG. 5 and/or another etching process.

The disclosed method employs an OCD metrology tool to measure critical dimensions and profile of patterned features after an etching process and adjusting the etching recipe for this and/or other etching processes. The OCD metrology tool may be connected to or integrated with the etching tool such that the AEI processing is real time and more efficient. More generally, the OCD metrology tool may be selected from the group consisting of a scatterometry, an optical digital profilometry, an optical spectrum analyzer, and other suitable optical metrology tools. A substrate wherein the patterned features formed thereon may not only be a mask substrate and may be extended to include a semiconductor wafer.

Figure 6:
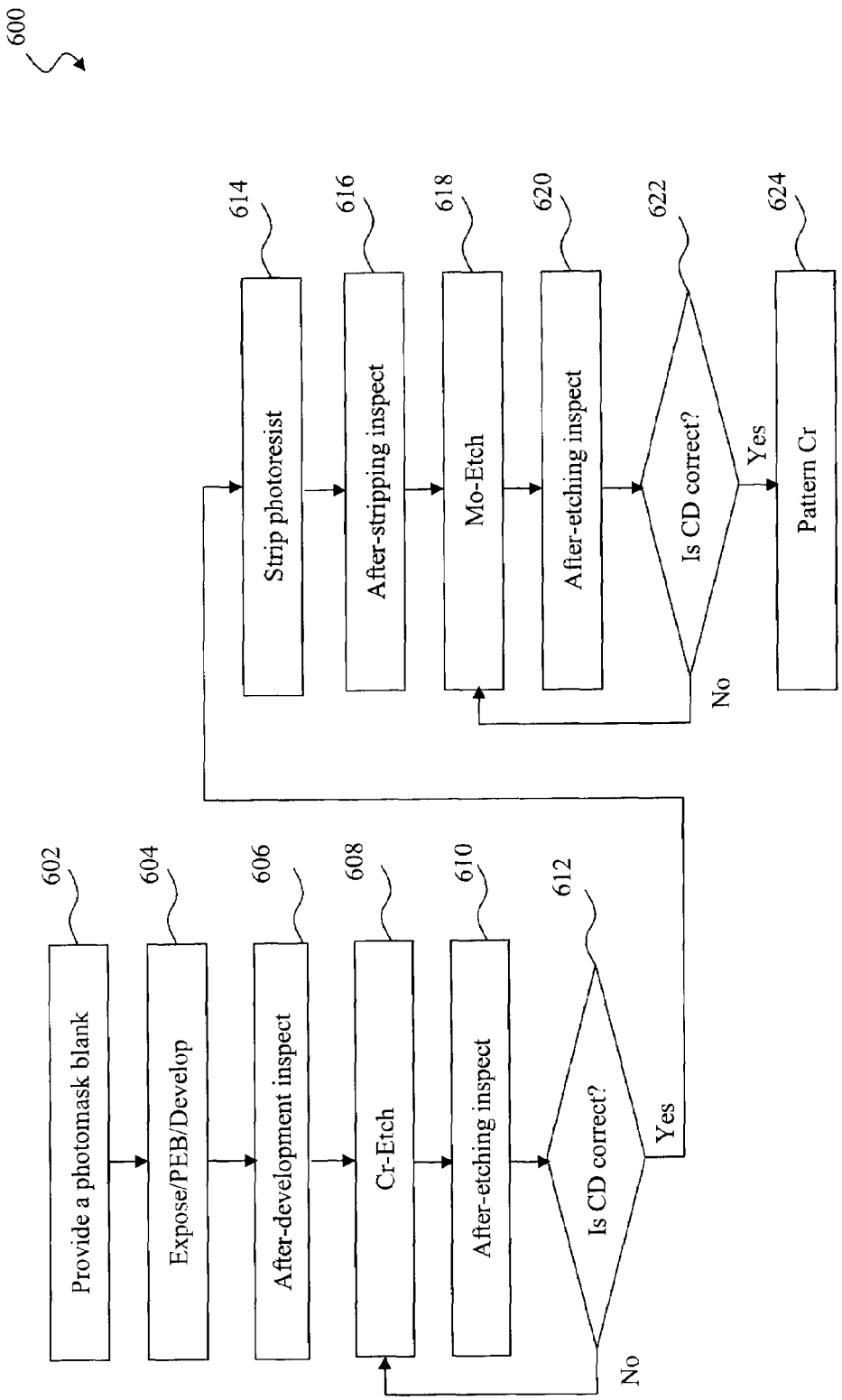
FIG. 6 illustrates another embodiment of a method for identifying a CD error during a manufacturing process and adjusting the process to compensate for that error.

Referring now to FIG. 6, a method 600 is another embodiment for identifying a CD error during a manufacturing process and adjusting the process to compensate for that error.

With additional reference to FIGS. 7a to 7f of sectional views of an exemplary mask during various manufacturing stages, the method 600 is described below.

The method 600 begins at step 602 by providing a mask 700. The mask 700 may comprise a transparent substrate 702 having fused quartz ($SiO_2$), calcium fluoride ($CaF_2$), or other suitable material. The mask 700 may further comprise absorption layers formed using a plurality of processes and materials, similar to those of the mask 200. For example, the mask 700 may include a molybdenum silicide (MoSi) layer 704 and a chromium (Cr) layer 706. The mask 700 may further comprise a plurality of anti-reflective coating (ARC) layers disposed between various interfaces. The mask 700 may comprise a resist layer 708 overlying the absorption layers 704 and 708, coated by a method such as spin-on coating.

The method proceeds to step 604 to expose, post-exposure bake, and develop the resist layer 708 to form resist features 608 shown in FIG. 6b, which may be similar to the pre-patterning processes at step 112 of the method 100 in terms of formation, configuration, and composition. The method 600 may further include a step 606 to implement an after-development inspection (ADI) similar to ADI of step 112 in the method 100.

Similarly, the method 600 proceeds to step 608 to etch the Cr layer 706 to form Cr features 606 shown in FIG. 6c, and then implement an after-etching inspection (AEI) process at step 610. The AEI may be performed by one or more metrology tools for defects, contamination, and critical dimension. Furthermore, AEI comprises an optical critical dimension (OCD) metrology tool to measure critical dimension and/or profile of the patterned features 708 and/or 706. The OCD metrology tool may be substantially similar to the one used at step 114.

The method 600 proceeds to step 612, in which a determination is made as to whether the etching is achieved and CDs are within a predefined specification. If the CD is not correct, the method 600 returns to step 608 and performs an additional etching process on the mask. This additional etching process may take place in the same etching tool as the original step 608, or may take place in another etching tool. The steps 608-612 may be repeated until the CD measurements fall within a desired range. In some embodiments, step 608 and/or step 610 may be performed simultaneously with step 612 and the original etching process may be continued (rather than using an additional etching step). In other embodiments, the mask 700 may not undergo a further etching process, but the method 600 may be used to adjust etching parameters (e.g., duration, power, and/or temperature) of the etching process based on the CD measurements. If the CD measurements are correct (e.g., fall within a predefined range), then the method 600 continues to step 614 to strip the resist layer 608 as illustrated in FIG. 6d and may further include an after-stripping inspection (ASI) at step 616. In another embodiment, the determination may comprise adjusting recipe of a different etching process.

The method 600 proceeds to step 618 to etch the MoSi layer 704 using the patterned Cr layer 706 as a hard mask to form patterned MoSi features as shown in FIG. 6e. The MoSi etching may be alternatively implemented before the resist stripping. Another after-etching inspection (AEI) step 620 is then implemented for measuring and profiling the Cr layer 706 and/or the MoSi layer 704. The AEI 620 may be performed by one or more metrology tools to inspect for defects, contamination, and critical dimension. Furthermore, the AEI comprises an OCD metrology tool similar to those OCD metrology tools described earlier.

The method 600 proceeds to step 622, in which a determination is made as to whether the etching is achieved and CD is within a predefined specification. Similarly, if the CD is not correct, the method 600 returns to step 618 and performs an additional etching process to remove MoSi layer on the mask. The additional etching process may take place in the same etching tool as the original step, or may take place in another etching tool. The steps 618-622 may be repeated many times until it is determined in step 622 that the CD measurements fall within a desired range.

Figure 7A:
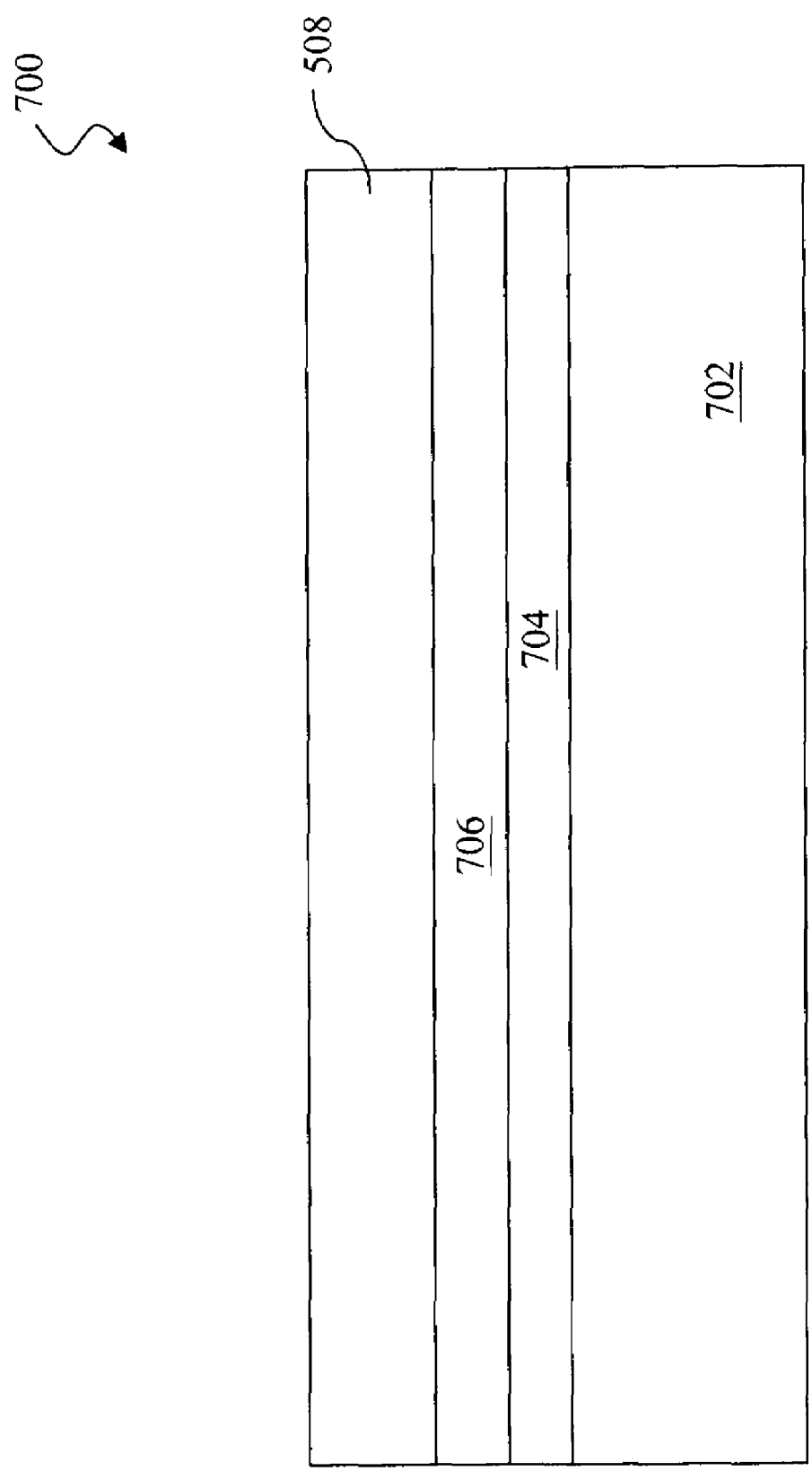
Figure 7B:
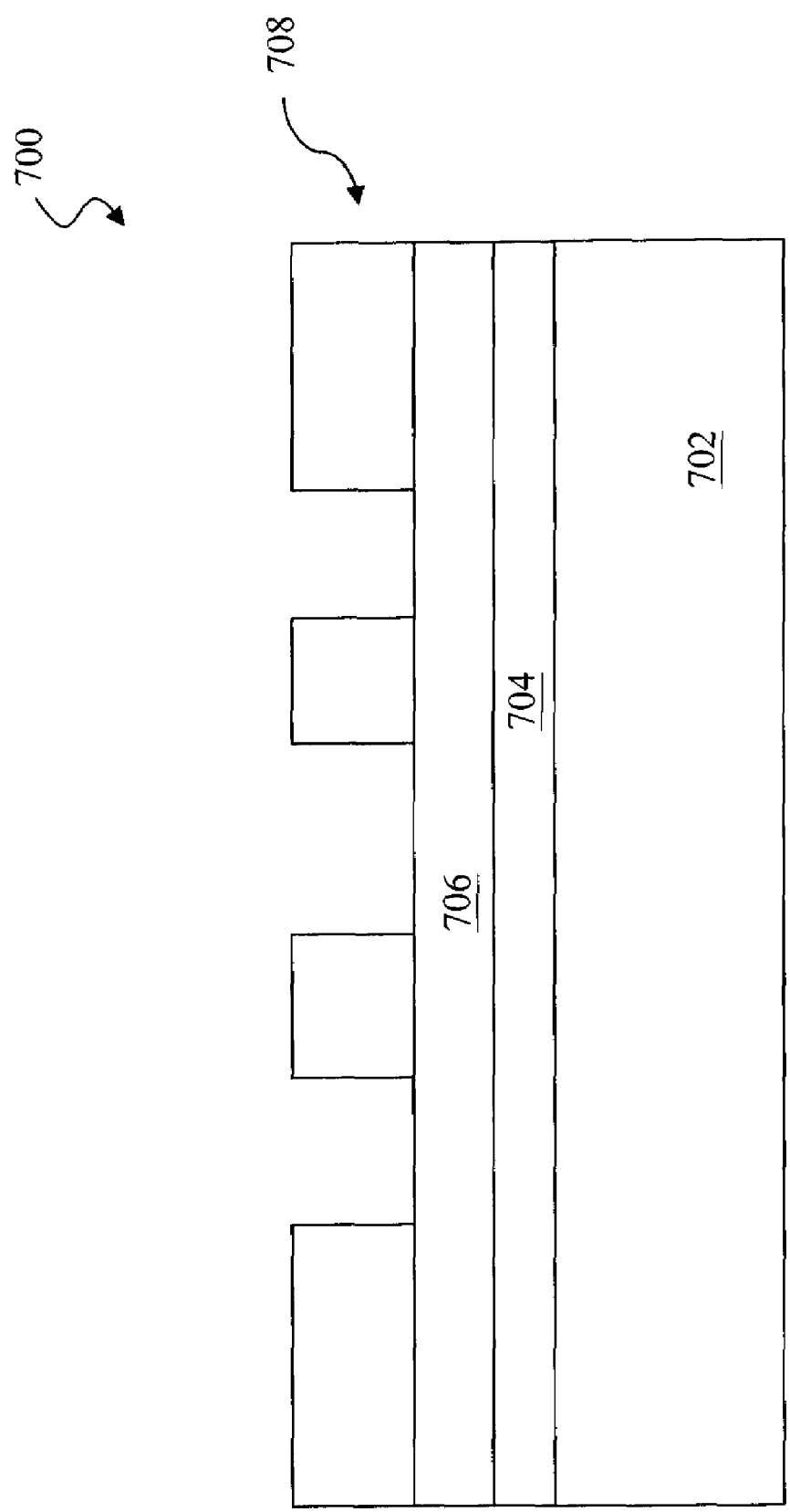
Figure 7C:
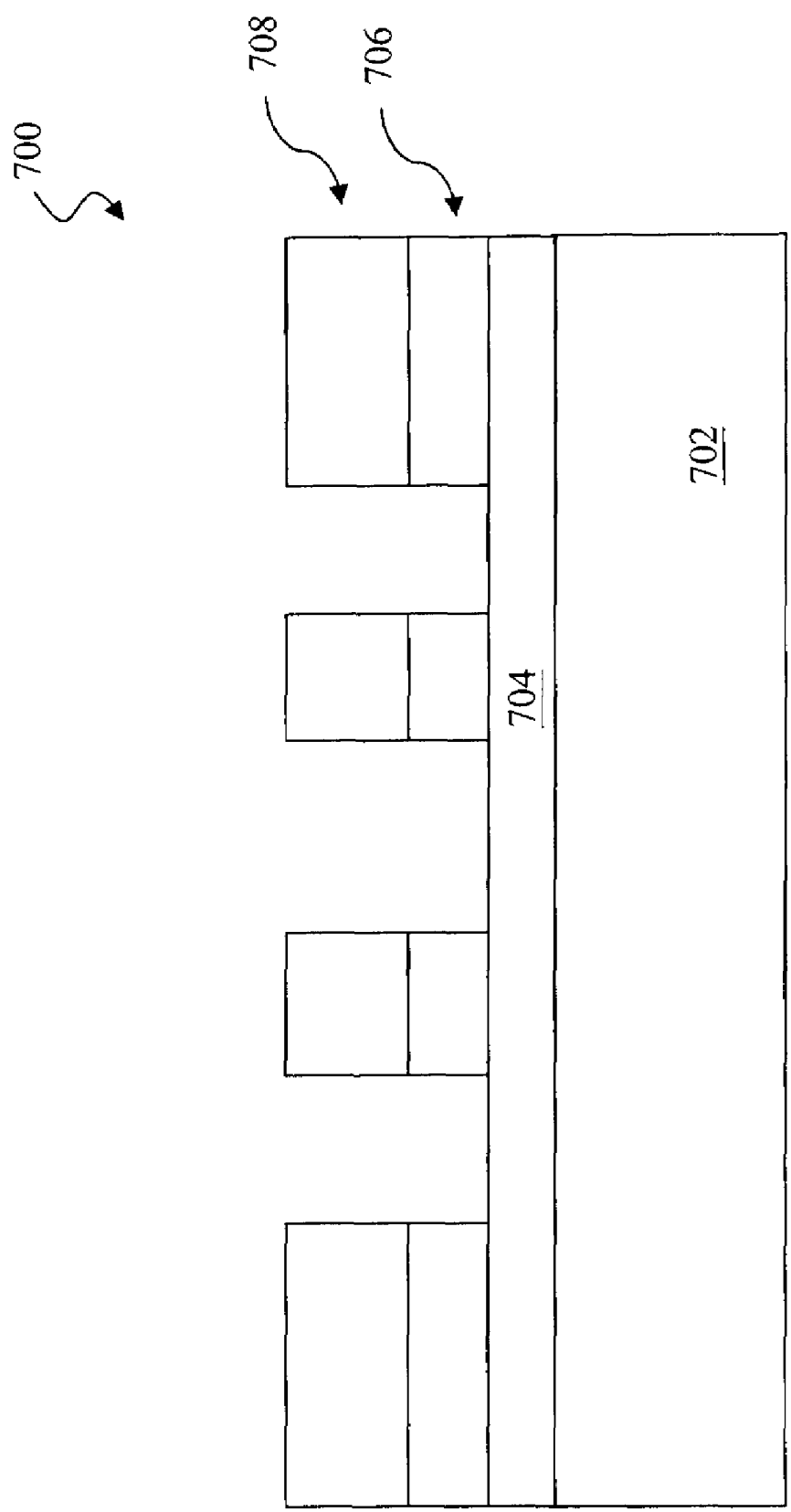
Figure 7D:
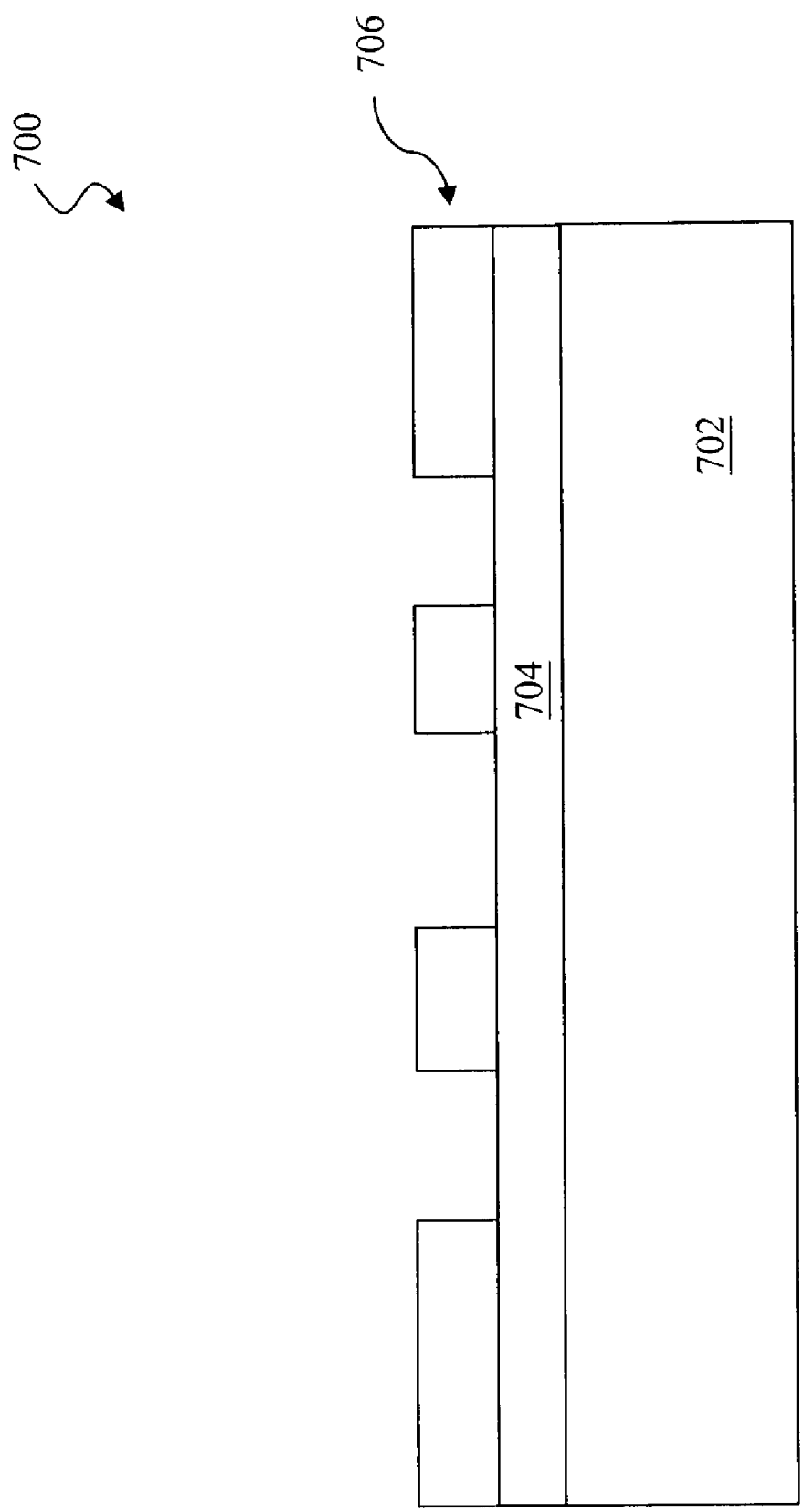
Figure 7F:
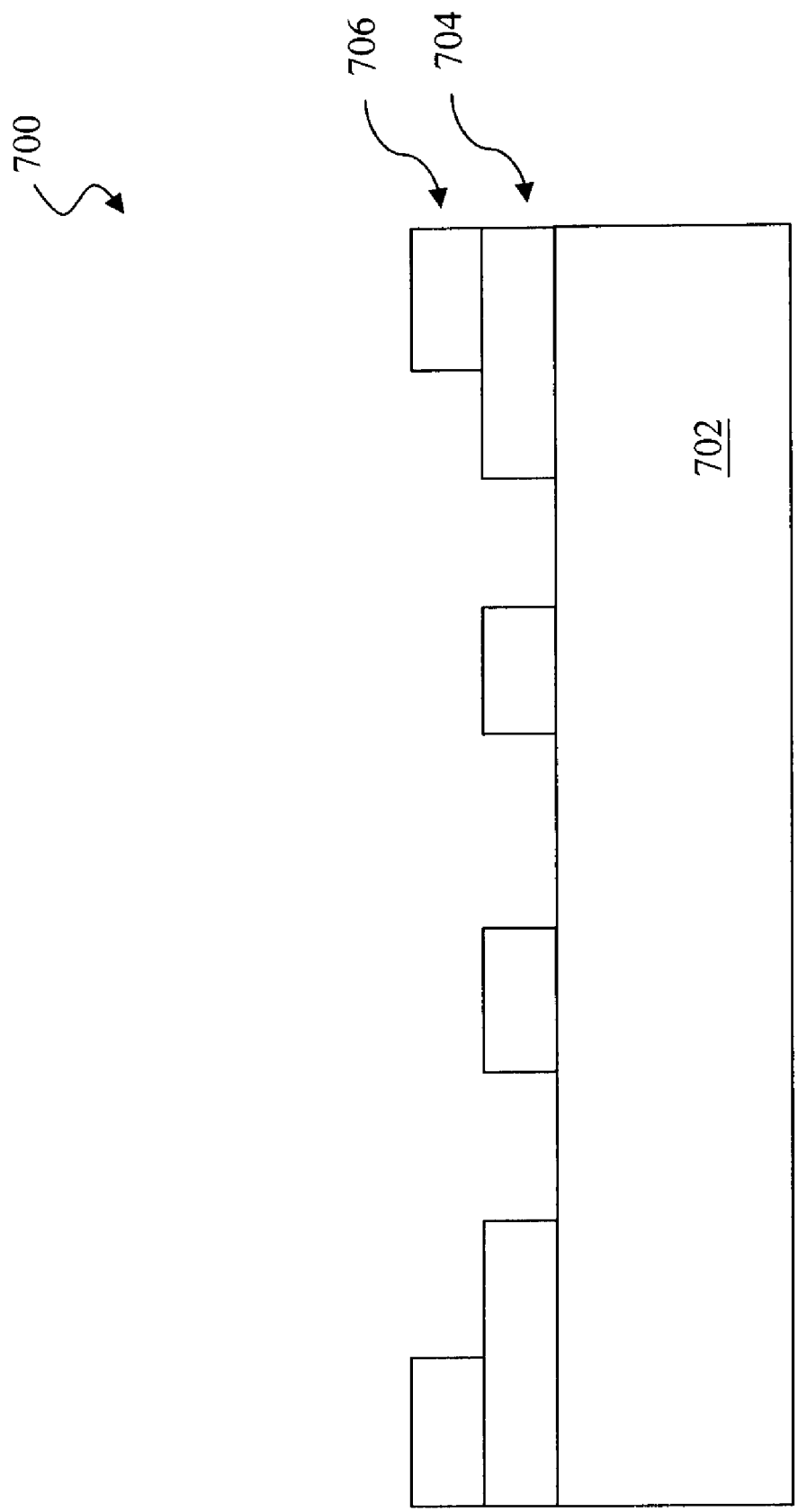

At step 624 of the method 600, the Cr layer may be further patterned using a method similar to the one described from step 602 to step 612 to form a patterned Cr layer that may have a pattern different from that of the patterned MoSi layer 704 as shown in FIG. 7f. Other processes may include resist stripping and after-stripping inspection. The method 600 only serves as another example of a method of mask fabrication process control according to the present disclosure.

Thus the present disclosure provides a method for patterning process control. The method comprises performing a first etching on a substrate to form a pattern; measuring the pattern of the substrate using an optical spectrum metrology tool; determining whether the measuring indicates that the etching step achieved a predefined result; and producing an etching recipe and performing a second etching of the substrate using the etching recipe if the predefined result was not achieved.

In the disclosed method, the substrate may be selected from the group consisting of a photomask and a semiconductor wafer. The photomask may include fused quartz. The photomask may further include a material layer formed on the fused quartz. The material layer may be selected from the group consisting of chromium (Cr) and molbdenum silicide (MoSi). The measuring may comprise measuring at least one of critical dimensions (CD) and profile of the pattern. The measuring profile of the pattern may provide batch-to-batch information. The performing a first etching, the measuring, and the performing a second etching may be utilized in an integrated manufacturing tool comprising a mean to etch and an mean to implement optical spectrum CD measurement. The measuring may comprise measuring at least one special pattern formed on the substrate. The second etching may be an additional etching for the first etching or a next etching step after the first etching. The method may further comprise: coating the substrate with a photoresist layer; exposing the photoresist layer; post-exposure baking the photoresist layer; and developing the photoresist layer before the performing a first etching. The method may further comprise stripping the photoresist layer after the performing a first etching. The optical spectrum metrology tool may comprise a tool selected from the group consisting of a scatterometry, an optical digital profilometry, and an optical spectrum analyzer. The first and second etchings may comprise a process selected from a dry etching and a wet etching.

The present disclosure provides another method of fabricating a photomask. The method comprises: etching a chromium (Cr) layer overlying a phase-shift layer formed on a photomask substrate; inspecting the Cr layer using a first optical spectrum metrology tool and determining if the etching a Cr layer achieved a predefined Cr result; performing an additional Cr etching of the Cr layer if the predefined Cr result was not achieved; etching the phase-shift layer underlying the Cr layer; inspecting the phase-shift layer using a second optical spectrum metrology tool and determining if the etching a phase-shift layer achieved a predefined phase-shift result; and performing an additional phase-shift etching of the phase-shift layer if the predefined phase-shift result was not achieved.

In this method, the phase-shift layer may comprise molbdenum silicide (MoSi). The measuring may comprise measuring critical dimensions and profile of the pattern. The inspecting the Cr layer and the inspecting the MoSi layer each may comprise producing an etching recipe. The performing an additional Cr etching and the performing an additional MoSi etching each may be repeated such that the photomask has a mean-to-target critical dimension less than about 7 nm and a mean-to-target phase less than about 3°.

The present disclosure provides a system for fabricating a photomask. The system comprises an etching tool designed to etch the photomask and an optical spectrum metrology tool to perform a measurement of critical dimensions of the photomask. The optical spectrum metrology tool is designed to communicate and coordinate with the etching tool. The system also includes a module designed to evaluate the measurement and produce an etching recipe according to the measurement.

The system may further comprise means for exposing a photoresist layer on the photomask; means for baking the photoresist layer on the photomask; and means for developing the photoresist layer on the photomask. The optical spectrum metrology tool may be integrated into the etching tool such that a measurement by the optical spectrum metrology tool and an etching process by the etching tool are performed in an same vacuum system. The optical spectrum metrology tool may comprise a tool selected from the group consisting of a scatterometry, an optical digital profilometry, and an optical spectrum analyzer.

The present disclosure also provides a method for patterning a substrate in a batch, comprising: performing a first etching on the substrate to form a pattern; measuring the pattern of the substrate using an optical spectrum metrology tool; and determining pattern profile variation from batch to batch. In the disclosed method, the pattern profile variation from batch-to-batch may be utilized to tune etching recipe for various substrates in the batch. The pattern profile variation from batch to batch may be utilized to tune exposure dose for various substrates in the batch.

While the preceding description shows and describes one or more embodiments, it will be understood by those skilled in the art that various changes in form and detail may be made therein without departing from the spirit and scope of the present disclosure. For example, various steps of the described methods may be executed in a different order or executed sequentially, combined, further divided, replaced with alternate steps, or removed entirely. In addition, various functions illustrated in the methods or described elsewhere in the disclosure may be combined to provide additional and/or alternate functions. Therefore, the claims should be interpreted in a broad manner, consistent with the present disclosure.

What is claimed is:

1. A method for patterning a substrate, comprising:
   forming a material layer on the substrate;
   forming a patterned photoresist layer over the material layer;
   performing a first etching on the material layer to form a pattern;
   measuring the pattern of the material layer using an optical spectrum metrology tool;
   determining whether the measuring indicates that the etching step achieved a predefined result;
   producing an etching recipe and performing a second etching of the material layer using the etching recipe if the predefined result was not achieved; and
   stripping the photoresist layer after the performing the first etching.

2. A method for patterning a substrate, comprising:
   forming a material layer on the substrate;
   forming a patterned photoresist layer over the material layer;
   performing a first etching on the material layer to form a pattern;
   measuring the pattern of the material layer using an optical spectrum metrology tool;
   determining whether the measuring indicates that the etching step achieved a predefined result; and
   producing an etching recipe and performing a second etching of the material layer using the etching recipe if the predefined result was not achieved;
   wherein the material layer is selected from the group consisting of chromium and molbdenum silicide.

3. The method of claim 1 wherein the substrate is selected from the group consisting of a photomask and a semiconductor wafer.

4. The method of claim 1 wherein the measuring comprises measuring at least one critical dimension (CD) and profile of the pattern.

5. The method of claim 4 wherein the measured profile of the pattern provides batch-to-batch information.

6. The method of claim 1 wherein the steps of performing a first etching, measuring, and performing a second etching are utilized in an integrated manufacturing tool comprising a means to etch and a means to implement optical spectrum CD measurement.

7. The method of claim 1 wherein measuring comprises measuring at least one special pattern formed on the material layer.

8. The method of claim 1 wherein the second etching is an optional, additional etching for the first etching.

9. The method of claim 1 wherein the forming the patterned photoresist layer includes:
   coating the material layer with a photoresist layer;
   exposing the photoresist layer;
   post-exposure baking the photoresist layer; and
   developing the photoresist layer before the performing the first etching.

10. The method of claim 1 wherein the optical spectrum metrology tool utilizes a technique selected from the group consisting of scatterometry, optical digital profilometry, and optical spectrum analysis.

11. The method of claim 1 wherein the first and second etchings comprises a process selected from a dry etching and a wet etching.

12. A method of fabricating a photomask, comprising:
   etching a chromium (Cr) layer overlying a phase-shift layer formed on a photomask substrate;
   inspecting the Cr layer using a first optical spectrum metrology tool and determining if the etching a Cr layer achieved a predefined Cr result;
   performing an additional Cr etching of the Cr layer if the predefined Cr result was not achieved;
   etching the phase-shift layer underlying the Cr layer;
   inspecting the phase-shift layer using a second optical spectrum metrology tool and determining if the etching a phase-shift layer achieved a predefined phase-shift result; and
   performing an additional phase-shift etching of the phase-shift layer if the predefined phase-shift result was not achieved.

13. The method of claim 12 wherein the phase-shift layer comprises molybdenum silicide (MoSi).

14. The method of claim 12 wherein the measuring comprises measuring critical dimensions and profile of the pattern.

15. The method of claim 12 wherein the inspecting the Cr layer and the inspecting the MoSi layer each comprises producing an etching recipe.

16. The method of claim 12 wherein the performing an additional Cr etching and the performing an additional MoSi etching each is repeated such that the photomask has a mean-to-target critical dimension less than about 7 nm and a mean-to-target phase less than about 3°.

* * * * *